United States Patent [19]
Park

[11] Patent Number: 5,965,906
[45] Date of Patent: *Oct. 12, 1999

[54] LIQUID CRYSTAL DISPLAY ELEMENT AND MANUFACTURING METHOD THEREOF

[75] Inventor: Woon-Yong Park, Suwon, Rep. of Korea

[73] Assignee: Samsung Electronics Co., Ltd., Kyungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/600,109

[22] Filed: Feb. 12, 1996

[30] Foreign Application Priority Data

Feb. 11, 1995 [KR] Rep. of Korea ............... 95-2508

[51] Int. Cl.⁶ ..................................... H01L 29/04
[52] U.S. Cl. ................... 257/72; 257/59; 349/54
[58] Field of Search .............. 257/59, 72; 349/54, 349/55

[56] References Cited

U.S. PATENT DOCUMENTS 5,076,666  12/1991  Katayama et al. .................. 349/55
5,121,236   6/1992  Ukai et al. ......................... 257/72

*Primary Examiner*—Mark V. Prenty
*Attorney, Agent, or Firm*—Pillsbury Madison & Sutro LLP

[57] ABSTRACT

A liquid crystal display (LCD) has a plurality of pixels, each having an aperture region. A LCD display element includes a shorting metal formed outside of the pixel aperture region for converting defective pixels into black defects. The shorting metal is formed from the same material used in, and during the same manufacturing step of, forming the TFT gate electrode. Therefore, the pixel aperture ratio is not reduced and subsequent steps to form the shorting metal are unnecessary.

5 Claims, 6 Drawing Sheets

LIQUID CRYSTAL DISPLAY ELEMENT AND MANUFACTURING METHOD THEREOF

BACKGROUND OF THE INVENTION

1. Field of the Invention

The present invention relates to a liquid crystal display element and a manufacturing method therefor. More particularly, the present invention relates to a liquid crystal display element and manufacturing method in which shorting metal for treating defective pixels is formed outside the pixel aperture region during fabrication of the display element.

2. Description of the Related Art

Active matrix liquid crystal displays (LCDs) typically operate in a white mode. When individual display pixels become defective, as shown in FIG. 1, a laser welding technique is used to connect a shorting metal 28 between a pixel electrode 15 and a source line 19 in order to convert the defective pixel into a black defect (otherwise referred to as a dark defect). However, this conventional technique has some disadvantages, some of which are described below.

First, the aperture ratio of the aperture region is reduced because the shorting metal 28 is formed partially within the pixel electrode. Further, because the shorting metal 28 is at a floating potential, parasitic capacitance develops between the pixel electrode 15 and the source line 19. This in turn degrades picture quality.

In another conventional technique shown in FIG. 2, a pixel electrode 151 is electrically connected with a source line 191 using a shorting metal. In this thin film transistor (TFT), a gate electrode 251 extends outward from the gate line 181. A defective pixel is transformed into a black defect by disconnecting the gate electrode 251 from a gate line 181 (shown by gap 182) using a laser, for example. However, this technique has several problems as well.

First, when the gate electrode 251 is formed on the gate line 181 as shown in FIG. 2, to extend a pixel aperture ratio, it is difficult for this technique to be adapted unless the gate line 181 consists of two lines. Moreover, even if the gate line 181 consists of two lines, when the gap 182 is insufficient to disconnect the gate electrode 251 from the gate line 181, this technique can't be adapted.

SUMMARY OF THE INVENTION

An object of the present invention is to provide a LCD with reliable defective pixel treatment in which the problems of conventional techniques are avoided. It is another object to provide a manufacturing method for this LCD which does not require additional steps.

In order to achieve these and other objects, a LCD display element according to the present invention includes a shorting metal formed outside of the pixel aperture region for converting defective pixels into black defects. The shorting metal is formed from the same material used in, and during the same manufacturing step of, forming the TFT gate electrode. Therefore, the pixel aperture ratio is not reduced and subsequent steps to form the shorting metal are unnecessary.

BRIEF DESCRIPTION OF THE DRAWINGS

The preferred embodiments of the present invention will be described in detail with reference to the attached drawings, wherein.

DESCRIPTION OF THE PREFERRED EMBODIMENT

The present invention will become apparent from a study of the following detailed description, when viewed in light of the accompanying drawings.

Figure 1:
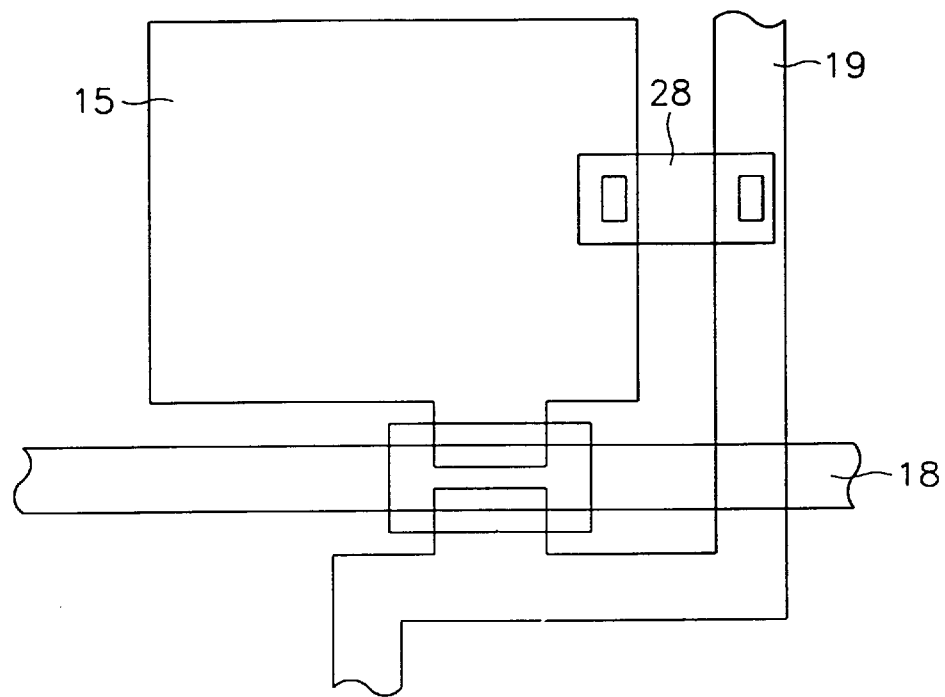
FIG. 1 is a plan view of a LCD pixel region showing a conventional technique for treating defective pixels.
Figure 2:
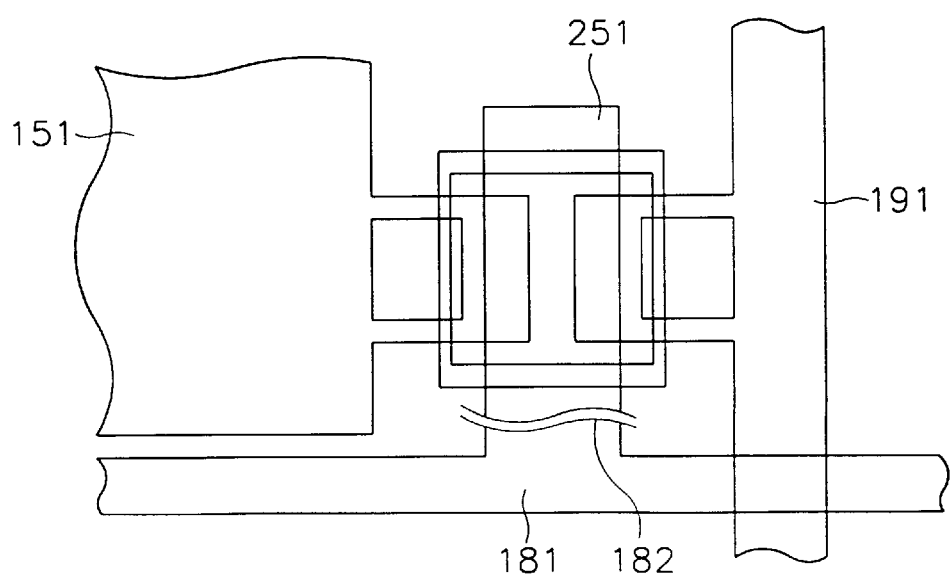
FIG. 2 is a plan view of a LCD pixel region showing another conventional technique for treating defective pixels.
Figure 3:
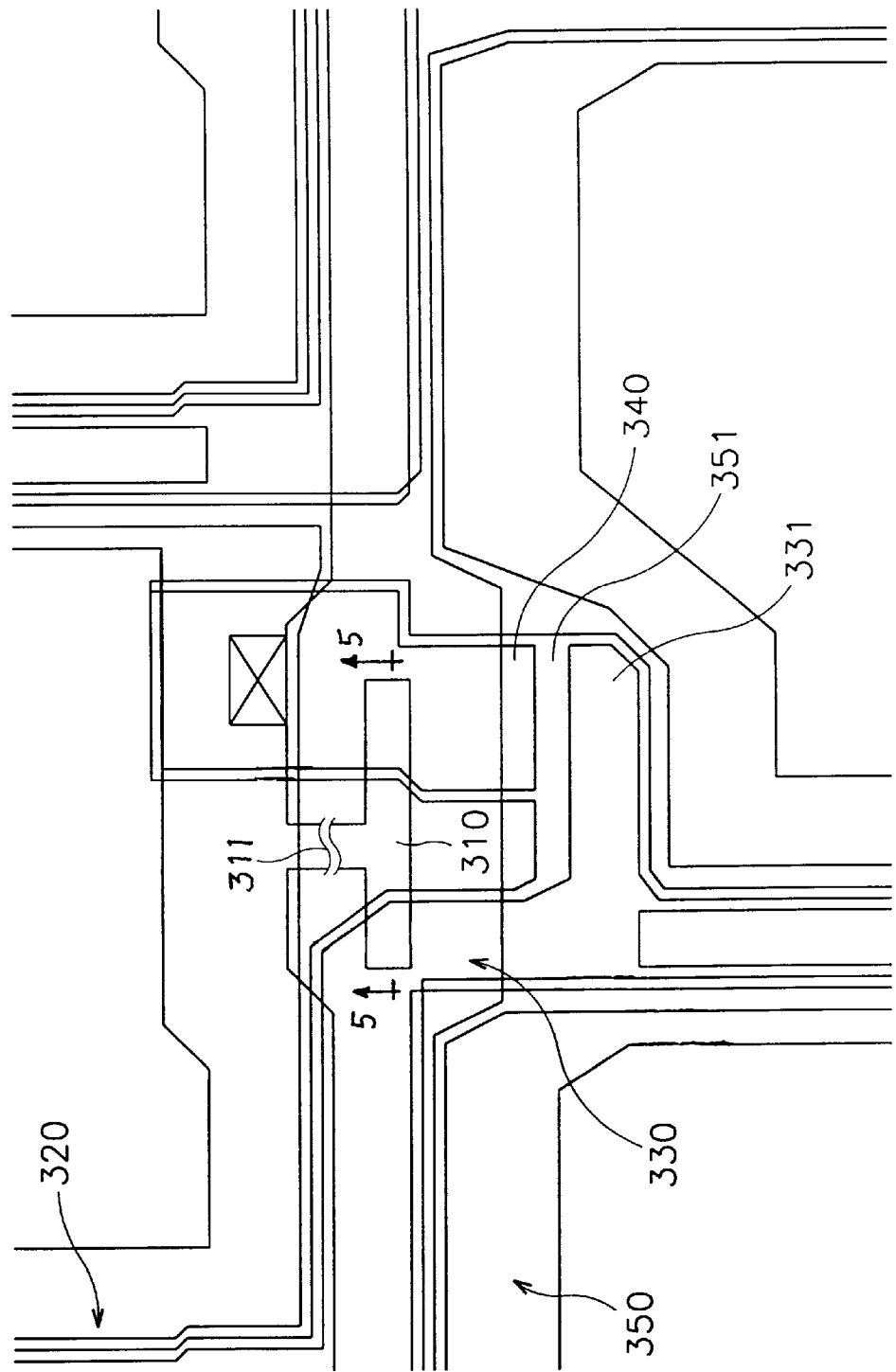
FIG. 3 is a plan view of a LCD pixel region according to a first embodiment of the present invention.

A TFT-LCD with reliable defective pixel treatment according to a preferred embodiment of the present invention is shown in FIGS. 3 through 6. As shown in FIG. 3, the LCD includes a plurality of pixels 320, each having an aperture region. A shorting metal 310 is formed outside of the aperture region of pixel 320 and is used for converting defective pixels into black pixels should the pixel 320 become defective.

Figure 5:
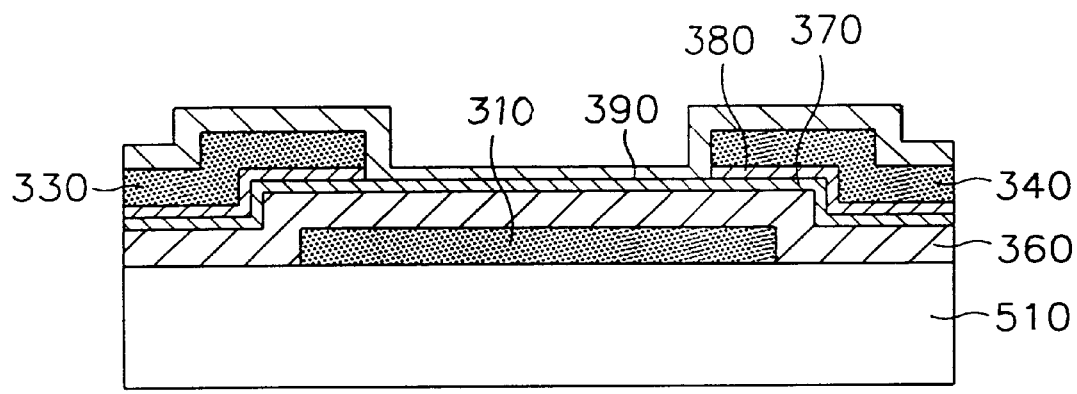
FIG. 5 is a cross-sectional view of a shorting metal region of a LCD display element, taken on the line 5—5 of FIG. 3.

As shown in FIG. 5, the shorting metal 310 overlaps with portions of a drain region 340 and a source line region 330. An insulating layer 360 is formed between the shorting metal 310 and the drain region 340 and between the shorting metal 310 and the source line 330.

Figure 6:
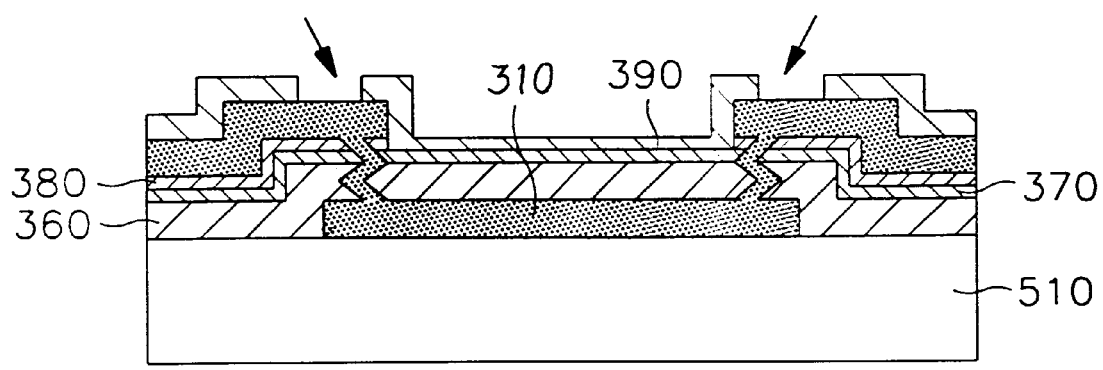
FIG. 6 is a cross-sectional view, taken on the line 5—5 of FIG. 3, of a shorting metal region welded by a laser.

When a defect in pixel 320 is detected, a laser is used to connect the shorting metal 310 with the source line 330 and with the drain electrode 340 through the insulating layer 360, as shown in FIG. 6. Thereafter, if mark 311 is cut, voltage from the source line 330 is applied to pixel 320 so that the defective pixel is transformed into a black defect.

Figure 4:
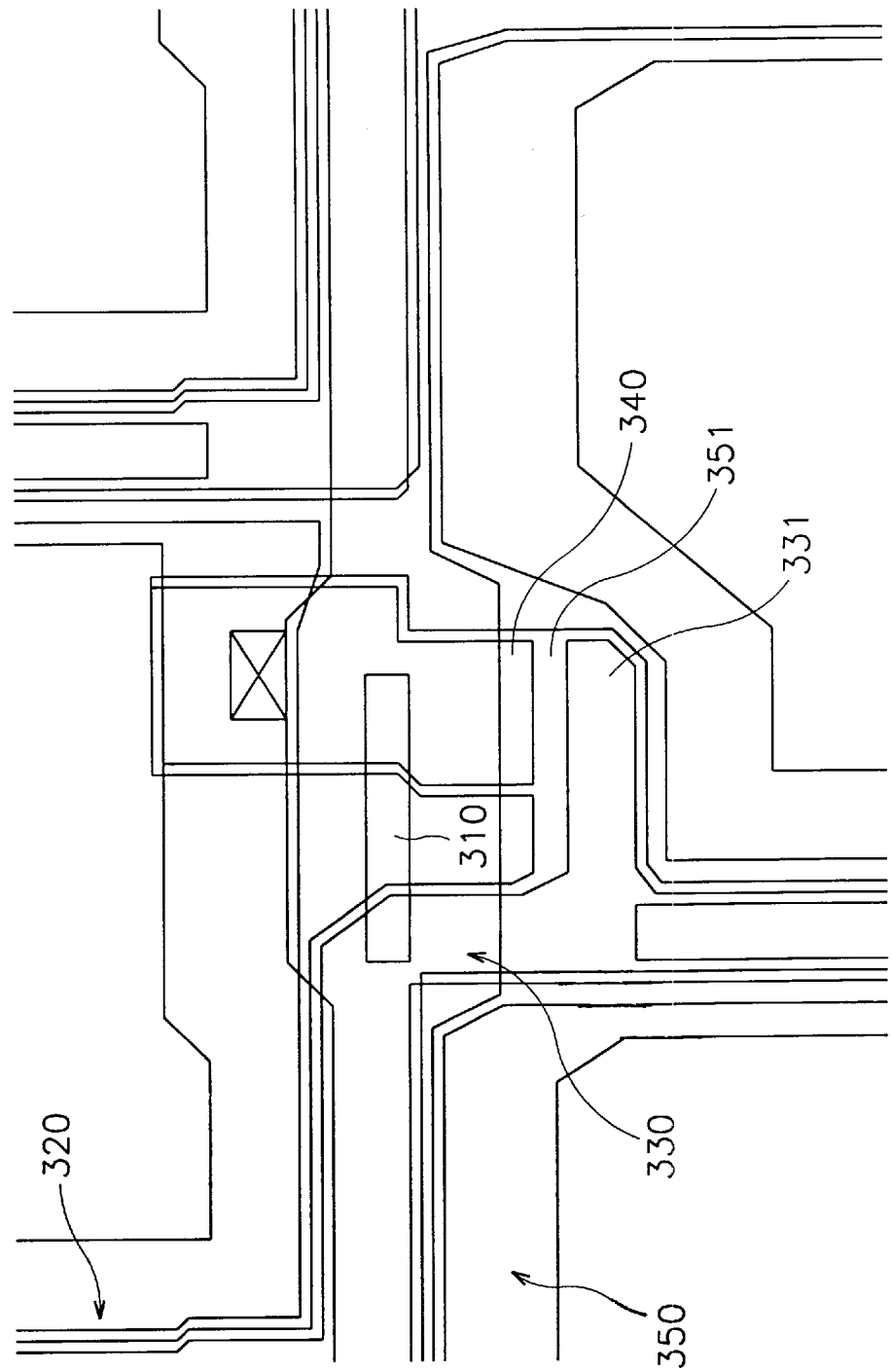
FIG. 4 is a plan view of a LCD pixel region according to a second embodiment of the present invention.

FIG. 3 shows the shorting metal formed outside the aperture region of pixel 320 and connected with a gate line. However, as shown in FIG. 4, according to another embodiment of the present invention, the shorting metal 310 can be formed separately from the gate line in an island configuration.

FIGS. 7A through 7E illustrate a method of making a LCD with reliable defective pixel treatment according to a preferred embodiment of the present invention. The method will be described hereinbelow with reference to FIG. 3 and FIGS. 7A through 7E.

Figure 7A:
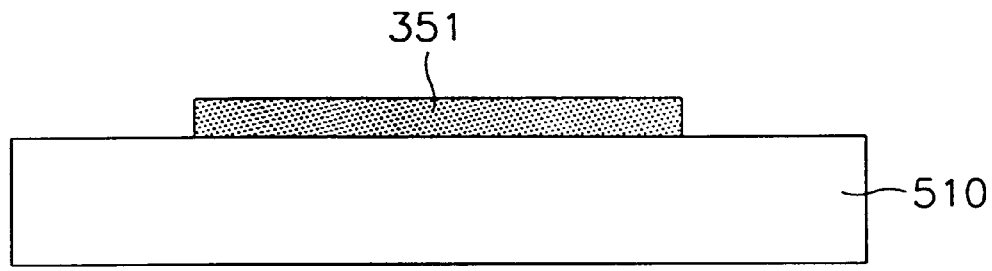
FIGS. 7A through 7E are cross-sectional views of a shorting metal region of a LCD display element showing a manufacturing method according to the present invention.

As shown in FIG. 7A or FIG. 3, a gate metal is deposited on a substrate 510. Then, a gate electrode 351, a previous or adjacent gate line 350 and a shorting metal 310 are formed by etching the gate metal. According to the present invention, the shorting metal is formed from the gate metal or a storage capacitance electrode metal. In this embodiment, the shorting metal is connected with the gate line, and the shorting metal is formed from the gate metal. Alternatively, the shorting metal can be connected with a common electrode, and the shorting metal can be formed from the storage capacitance electrode metal.

Figure 7B:
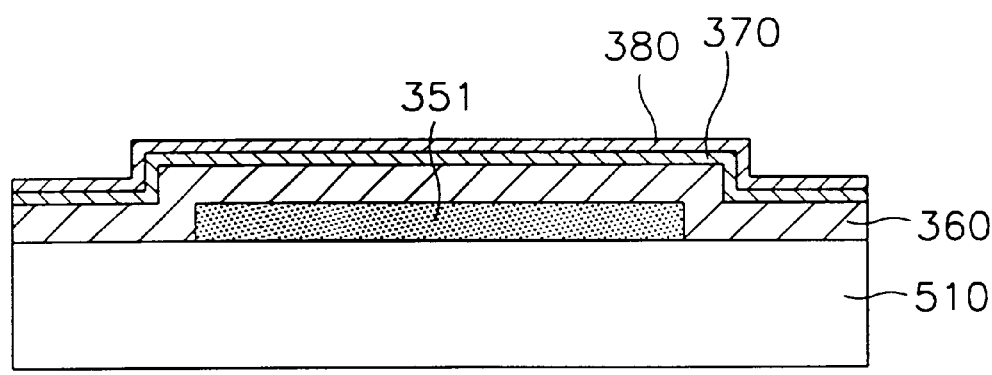

As shown in FIG. 7B or FIG. 3, a gate insulating layer 360, an amorphous silicon layer 370 and an $N^+$ type amorphous silicon layer 380 are sequentially formed over the gate electrode 351 so as to form a triple layer. Then, the triple layer 360, 370, 380 is patterned by photo etching.

Figure 7C:
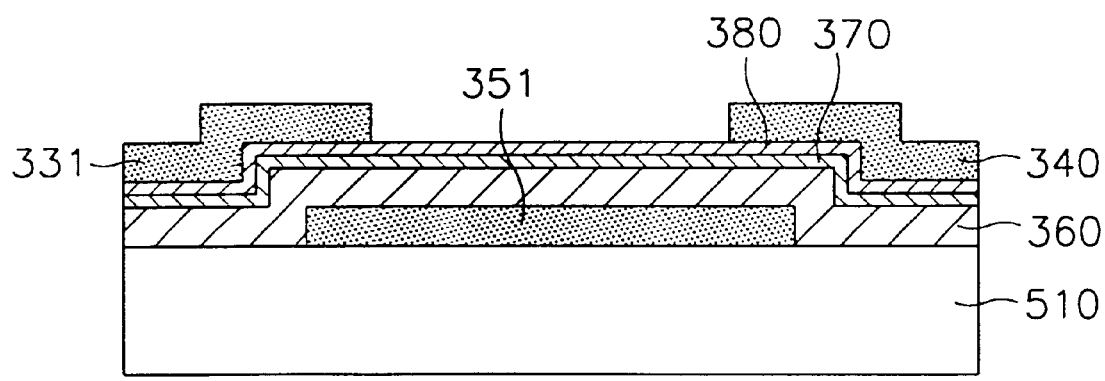

As shown in FIG. 7C or FIG. 3, a source/drain metal is then deposited on the patterned triple layer 360, 370, 380, and the source/drain metal is patterned by photo etching so as to form a source electrode 331, a drain electrode 340 and a source line 330.

Figure 7D:
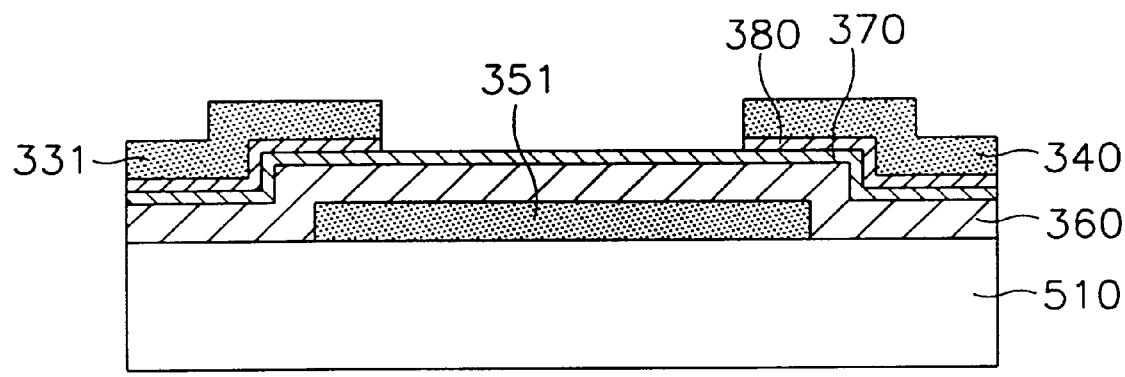

As shown in FIG. 7D or FIG. 3, using the source and drain electrodes 331, 340 as a mask, the N$^+$ type amorphous silicon layer 380 is patterned by photo etching.

Figure 7E:
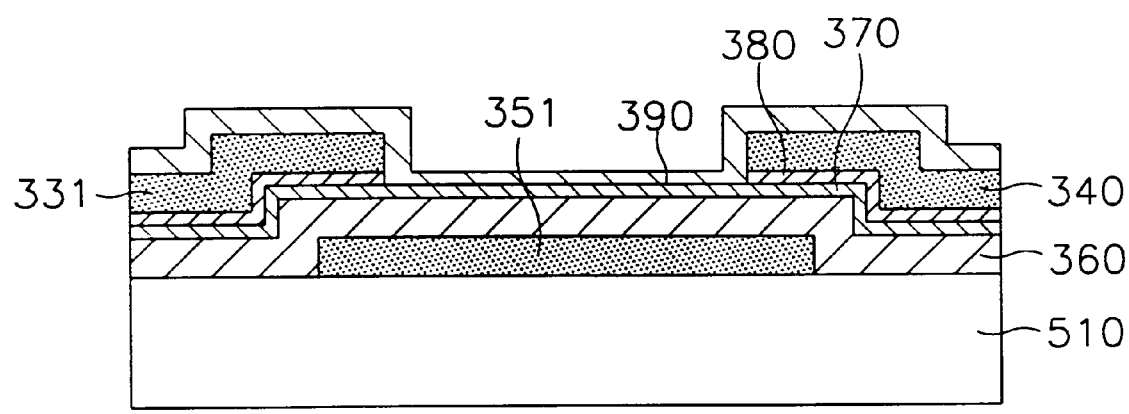

As shown in FIG. 7E, an insulating layer 390 is then deposited over the source and drain electrodes 331, 340 and the amorphous silicon layer 370. Thereafter, the insulating layer 390 is patterned by photo etching. Finally, a transparent conductive layer is formed thereover and photo etched so as to form a pixel electrode 320 as shown in FIG. 3.

According to the LCD and defective pixel treatment of the present invention, a pixel aperture ratio is increased by forming the shorting metal outside of the pixel aperture region. Thereafter, when a pixel defect is detected, the shorting metal is used to convert the defective pixel into a dark defect, for example, when the LCD operates in a normally white mode.

The present invention also has the advantage of preventing reduction in picture quality by forming the shorting metal using a gate forming metal or a common electrode forming metal.

Although the present invention has been herein described in detail with reference to the preferred embodiments thereof, those skilled in the art will readily appreciate that various modifications and substitutions can be made thereto without departing from the spirit and scope of the invention as set forth in the appended claims.

What is claimed is:

1. A liquid crystal display comprising:

a substrate;

a plurality of pixels, each having a pixel electrode;

a source line;

a drain electrode made in a layer different from the pixel electrode and connected to said pixel electrode;

a gate metal formed on a surface of said substrate; and a shorting metal and a gate electrode etched from said gate metal, said shorting metal overlapping portions of said source line and said drain electrode and said gate electrode, and said gate electrode being oriented in non-overlapping relationship with respect to the pixel electrode, whereby said shorting metal is shorted to overlapped portions of said source line and said drain electrode to convert a defective pixel into a black defect.

2. The liquid crystal display as defined in claim 1, further comprising a gate line, said shorting metal being connected with said gate line.

3. A structure of a pixel of a liquid crystal display, comprising:

a substrate;

a gate metal formed on a surface of said substrate;

a shorting metal and a gate electrode etched from said gate metal;

an insulating layer which is formed on said substrate and which covers said shorting metal and said gate electrode;

a semiconductor layer formed over said insulating layer;

a drain electrode and a source electrode formed on said semiconductor layer, and a source line connected to said source electrode; and a pixel electrode which is made in a layer different from the drain electrode and which is connected to said drain electrode, wherein said pixel electrode is oriented in non-overlapping relationship with respect to the gate electrode and wherein said shorting metal overlaps portions of said drain electrode and said source line.

4. A structure of a pixel of a liquid crystal display as defined in claim 3 wherein said shorting metal is connected to said source line and said drain electrodes through said insulating layer when said pixel is defective.

5. A structure of a pixel of a liquid crystal display as defined in claim 4, further comprising a gate line formed between said substrate and said insulating layer, said shorting metal and said gate electrode being connected with said gate line.

* * * * *